(12) United States Patent
Tanaka

(10) Patent No.: US 7,160,765 B2
(45) Date of Patent: Jan. 9, 2007

(54) METHOD FOR MANUFACTURING A SEMICONDUCTOR DEVICE

(75) Inventor: Koichiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 196 days.

(21) Appl. No.: 10/352,961

(22) Filed: Jan. 29, 2003

(65) Prior Publication Data

US 2003/0138999 A1 Jul. 24, 2003

Related U.S. Application Data

(62) Division of application No. 09/635,444, filed on Aug. 10, 2000, now Pat. No. 6,567,219.

(30) Foreign Application Priority Data

Aug. 13, 1999 (JP) ................................. 11-229516

(51) Int. Cl.
*H01L 21/84* (2006.01)
(52) U.S. Cl. .................................................... 438/166
(58) Field of Classification Search ........ 438/151–166, 438/308
See application file for complete search history.

(56) References Cited

U.S. PATENT DOCUMENTS

| 4,585,948 A | 4/1986 | Schneider et al. |
| 5,561,081 A | 10/1996 | Takenouchi et al. |
| 5,644,431 A | 7/1997 | Magee |
| 5,721,416 A | 2/1998 | Burghardt et al. |
| 5,897,799 A | 4/1999 | Yamazaki et al. |
| 5,900,980 A | 5/1999 | Yamazaki et al. |
| 5,959,779 A | 9/1999 | Yamazaki et al. |
| 5,968,383 A | 10/1999 | Yamazaki et al. |
| 6,002,101 A | 12/1999 | Yamazaki et al. |
| 6,002,523 A | 12/1999 | Tanaka |
| 6,038,075 A | 3/2000 | Yamazaki et al. |
| 6,157,492 A | 12/2000 | Yamazaki et al. |
| 2005/0019997 A1* | 1/2005 | Kusumoto et al. .......... 438/166 |

FOREIGN PATENT DOCUMENTS

| JP | 07-130652 | 5/1995 |
| JP | 09275081 A | * 10/1997 |
| JP | 10172911 | * 6/1998 |

* cited by examiner

*Primary Examiner*—Richard A. Booth
(74) *Attorney, Agent, or Firm*—Nixon Peabody LLP; Jeffrey L. Costellia

(57) ABSTRACT

In annealing of a non-single crystal silicon film by a linear laser beam, it is performed so as irradiation tracks caused by the linear laser beam do not remain in the silicon film. Laser light is partitioned by an integrally formed cylindrical array lens, and is composed into a single uniform laser beam on an irradiation surface by a cylindrical lens and a doublet cylindrical lens. The integrally formed cylindrical array lens is used, and therefore cylindrical lenses structuring this array lens can be made very fine. It thus becomes possible to partition the laser light into a large number of partitions, and the uniformity of the laser beam on the irradiation surface is increased. Very few laser irradiation tracks remain on the silicon film annealed by the very uniform laser beam.

18 Claims, 11 Drawing Sheets

Fig. 1
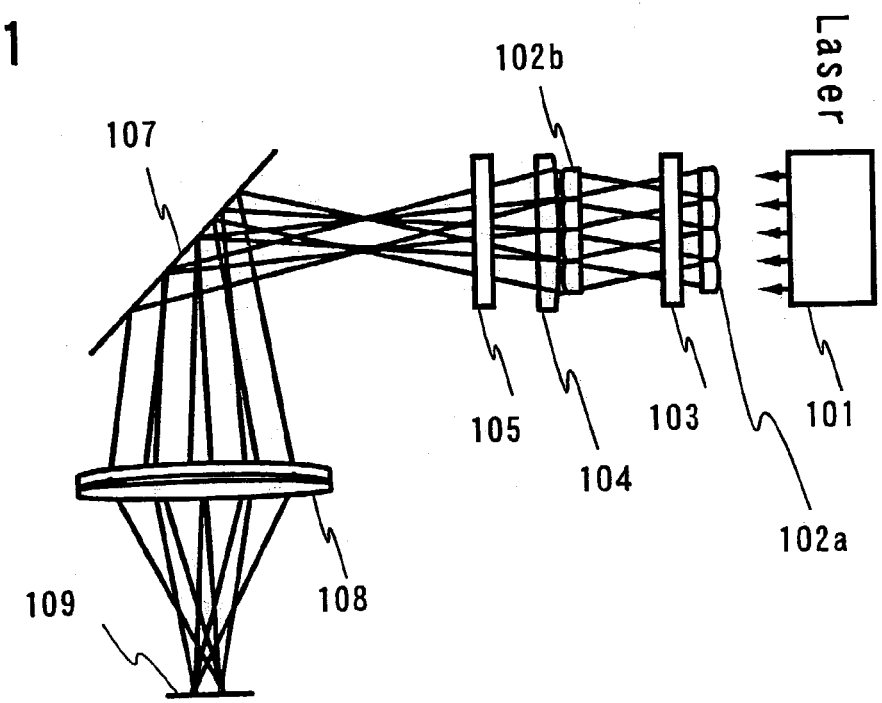
*Side View*
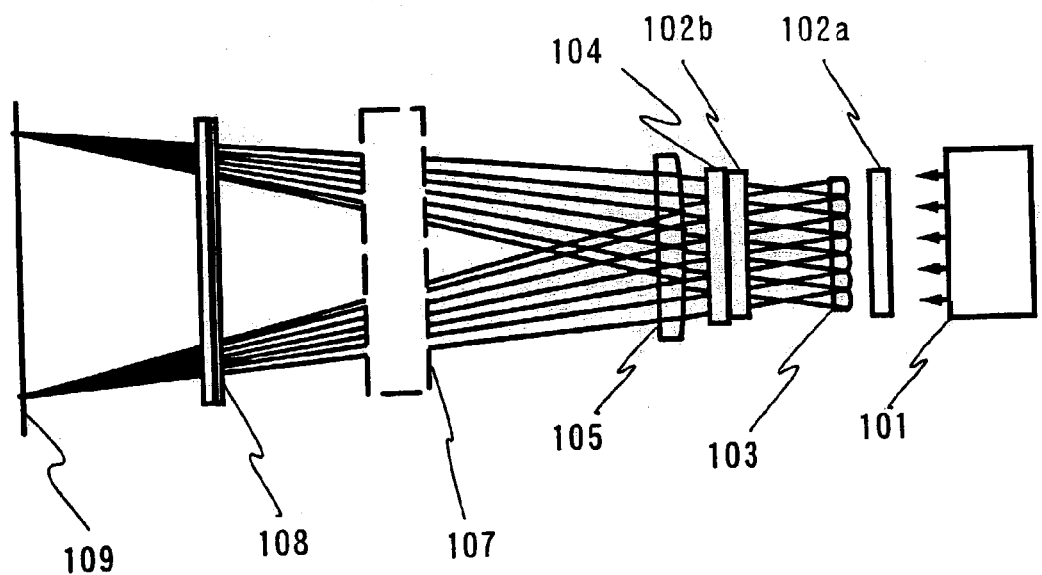
*Top View*

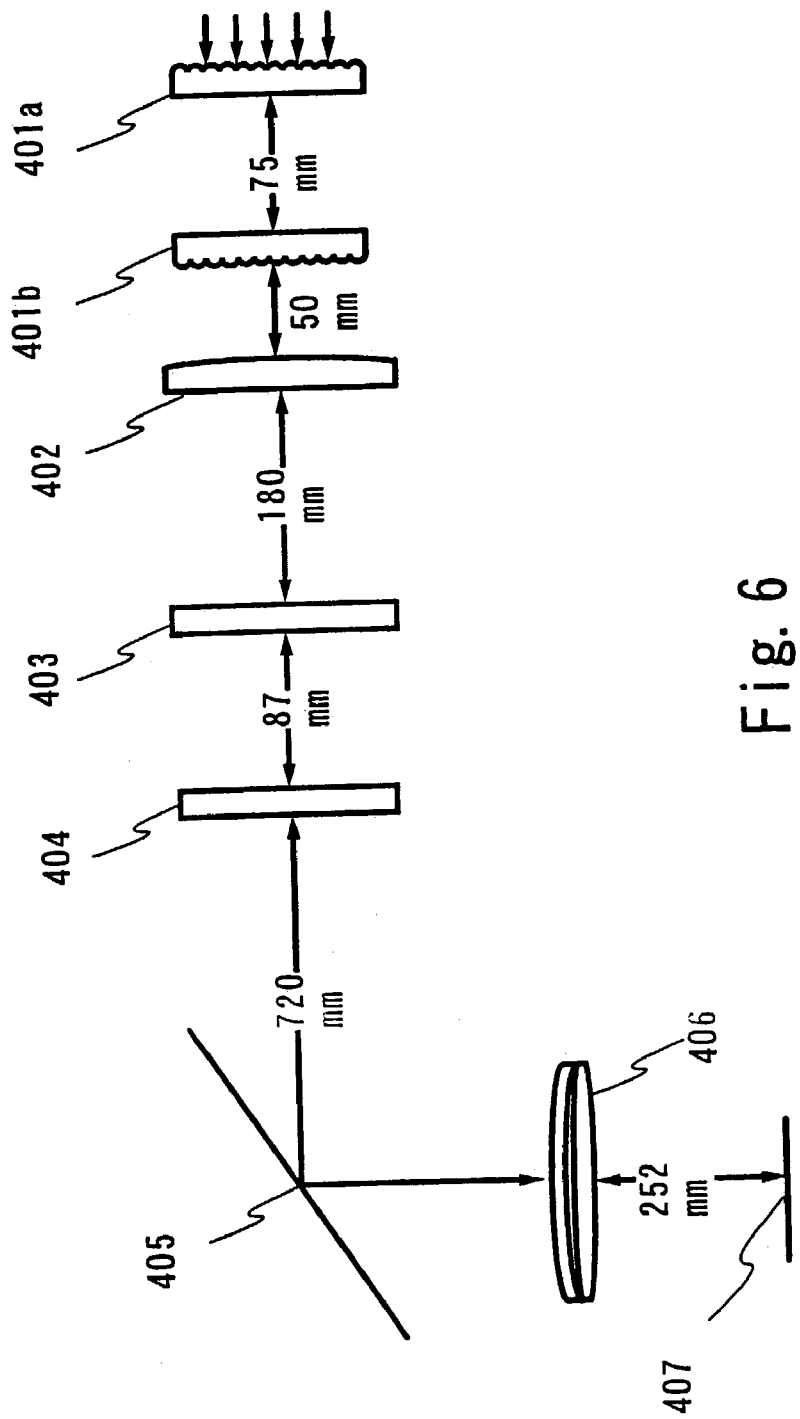

METHOD FOR MANUFACTURING A SEMICONDUCTOR DEVICE

BACKGROUND OF THE INVENTION

1. Field of the Invention

The present invention relates to a device for manufacturing a semiconductor device having a circuit constituted by a thin film. For example, the present invention relates to a device for manufacturing an electrooptical device typified by a liquid display device and the constitution of an electric device having the electrooptical device as a part. In this connection, in the present specification, a semiconductor device designates in general a device capable of functioning by the use of semiconductor characteristics and includes the above electrooptical device and electric device.

2. Description of the Related Art

In recent years, research and development have been widely conducted on the technologies for performing a laser annealing processing to an amorphous semiconductor film or a crystalline semiconductor film (semiconductor film which is not a single crystal but a polycrystal or a microcrystal), that is, non-single crystal semiconductor film formed on an insulating substrate such as a glass substrate or the like to crystallize the non-single crystal semiconductor film or to improve its crystallinity. A silicon film is often used as the above semiconductor film.

A glass substrate has advantages that it is cheap and has good workability and is easy to make a large area substrate in comparison with a quartz substrate which has been conventionally used. This is because the above research and development have been carried out. Also, it is because the melting point of the glass substrate is low that a laser is widely used for crystallizing the semiconductor film. The laser can apply high energy only to a non-single crystal film without increasing the temperature of the substrate too much.

The crystalline silicon film is called a polycrystalline silicon film or a polycrystalline semiconductor film because it is made of many crystal grains. Since the crystalline silicon film subjected to a laser annealing processing has high mobility, a thin film transistor (hereinafter referred to as TFT) is formed by the use of the crystalline silicon film and, for example, is widely used for a monolithic liquid crystal electrooptical device having a glass substrate on which TFTs for driving a pixel and for a driving circuit are formed.

Also, a laser annealing method of transforming the high-power laser beam of a pulse oscillation such as an excimer laser into a square spot several cm square or a linear beam 10 cm or more in length at an irradiate surface by the use of an optical system and of scanning a semiconductor film with the laser beam (or moving a spot irradiated with the laser beam relatively to an irradiate surface) has been widely used because it increases mass productivity and is excellent in an industrial view point.

In particular, when a linear laser beam is used, the whole irradiate surface is irradiated with the linear laser beam only by scanning the irradiate surface in the direction perpendicular to the direction of the line of the linear laser beam, which therefore produces high mass productivity. In contrast to this, when a spot-like laser beam is used, the irradiate surface needs to be scanned with the laser beam in the back-and-forth direction and in the right-and-left direction. The irradiate surface is scanned with the linear laser beam in the direction perpendicular to the direction of the line of the linear laser beam because the direction is the most efficient scanning direction. The method of using the linear laser beam into which the laser beam emitted from the excimer laser of pulse oscillation is transformed by the use of a suitable optical system for the laser annealing processing has become a mainstream technology.

In FIG. 1 is shown an example of the constitution of an optical system for transforming the cross section of the laser beam into a linear shape at an irradiate surface. This constitution not only transforms the cross section of the laser beam into the linear shape but also homogenizes the energy of the laser beam at the irradiate surface. In general, an optical system homogenizing the energy of the beam is called a beam homogenizer.

The side view is explained first. A laser beam leaving from a laser oscillator 101 is partitioned in a direction perpendicular to the movement direction of the laser beam by cylindrical array lenses 102a and 102b. This direction is referred to as a vertical direction throughout this specification. There are four partitions with this structure. The partitioned laser beams are once collected into a single laser beam by a cylindrical lens 104. This is then reflected by a mirror 107, and once again condensed into one laser beam on an irradiation surface 109 by a doublet cylindrical lens 108. The doublet cylindrical lens refers to a lens composed of two cylindrical lenses. The linear laser beam is thus given energy uniformity in the width direction, and the length of the width direction is thus determined.

The top view is explained next. The laser beam leaving from the laser oscillator 101 is partitioned in a direction perpendicular to the movement direction of the laser beam, and perpendicular to the vertical direction, by a cylindrical array lens 103. This direction is referred to as a horizontal direction throughout this specification. There are seven partitions with this structure. The laser beams are next made into a single beam on the irradiation surface 109 by the cylindrical lens 104. The linear laser beam is thus given energy uniformity in the longitudinal direction, and the length is thus determined.

The above lenses are manufactured by synthetic quartz in order to respond to the excimer laser. Further, coating of the lens surface is performed so as to make it very transmissive to the excimer laser. The transmissivity of the excimer laser by one lens thus becomes equal to or greater than 99%.

By performing laser annealing on the entire surface of a non-single crystal silicon film by irradiating the linear laser beam, processed by the above constitution, while gradually shifting it in the width direction, crystallization can be performed and crystallinity can be increased.

A model method of manufacturing a semiconductor film which becomes an irradiation object is shown next. First, a 5 inch diagonal Corning 1737 substrate having a thickness of 0.7 mm is prepared. A $SiO_2$ film (silicon oxide film) of 200 nm thickness is deposited on the substrate by using a plasma CVD apparatus, and an amorphous silicon film (hereafter referred to as an a-Si film) of 50 nm thickness is formed on the surface of the $SiO_2$ film.

The substrate is heated for 1 hour at a temperature of 500° C. in a nitrogen atmosphere, decreasing the hydrogen concentration within the films. The laser resistance of the film is thus significantly increased.

A Lambda Corp. XeCl excimer laser (wavelength 308 nm, pulse width 30 nm) L3308 is used as a laser apparatus. The laser apparatus is a pulse emission type, and possesses the capability of delivering energy of 500 mJ/pulse. The size of the laser beam is 10×30 mm (both values are half-widths) at the exit of the beam. The shape of a laser beam generated by an excimer laser is generally a rectangular shape, and expressed as an aspect ratio, is in the range of approximately 3 to 5. The strength of the laser beam shows a Gaussian distribution, in which its strength increases as it approaches the center. The size of the laser beam is transformed into a 125 mm×0.4 mm linear laser beam having a uniform energy distribution by an optical system possessing the structure shown in FIG. 1.

According to experiments performed by the applicant of the present invention, when the laser is irradiated on the above semiconductor film, the overlap pitch is most suitable at approximately 1/10 of the width (half width) of the linear laser beam. The uniformity of crystallinity within the film is thus increased. In the above example, the half width is 0.4 mm, and therefore the pulse frequency of the excimer laser is set to 30 hertz, the scanning speed is set to 1.0 mm/s, and the laser beam is irradiated. The energy density of the laser beam in the irradiation surface is 420 mJ/cm$^2$ at this time. The method used here to crystallize the semiconductor film using the linear laser beam is an extremely general method.

If the pulse emission excimer laser beam is processed into a linear shape by an optical system such as the one stated above, and then if the linear laser beam is irradiated while scanning, on a non-single crystal silicon film, for example, then a polycrystalline silicon film is obtained.

A phenomenon of film striping running in the vertical and horizontal directions is conspicuous when observing the polycrystalline silicon film obtained. (See FIG. 2.)

The semiconductor characteristics differ with each of the stripes, and therefore if the striped state film is used when manufacturing an integrated driver and pixel (system on panel) liquid crystal display, a problem develops in which the strips are output to the screen as are. The stripes output on the screen are caused by non-uniform crystallinity in both a driver portion and a pixel portion. This problem is being improved by improving the film quality of the laser beam and the quality of the non-single crystal silicon film which becomes the irradiation object of the laser beam, and has been improved to such an extent that, depending upon the liquid crystal display manufactured, it does not become a problem. However, when manufacturing a liquid crystal display with higher definition and good characteristics, the above striping nonetheless becomes a problem. The present invention is for solving this problem.

The main reasons that the above striped pattern is generated are: energy diffusion near the edges in the width direction of the linear laser beam (expressing a state in which the energy is attenuated as the edge of the laser beam is approached); and non-uniformity of energy in the longitudinal direction of the linear laser beam. An energy diffusion region is defined throughout this specification as a region having an energy density equal to or less than 90% of the maximum energy density within the linear laser beam.

The energy diffusion near the edge in the width direction of the linear laser beam becomes a cause of the formation of the stripe pattern in a direction parallel to the longitudinal direction of the linear laser beam. Furthermore, the energy non-uniformity in the longitudinal direction of the linear laser beam becomes a cause of the formation of the stripe pattern in a direction orthogonal to the longitudinal direction of the linear laser beam.

In order to resolve the problem of non-uniform energy in the longitudinal direction of the linear laser beam, an increase in the number of cylindrical array lenses 102 and 103 is considered.

The number of partitions of the cylindrical array lenses in the above example is four vertical partitions and seven horizontal partitions, for a total of 28 partitions. Tests for increasing the uniformity of the laser anneal by increasing the number of partitions have been performed over many years. Some examples of such tests are given below.

The size of one cylindrical lens structuring the four partition cylindrical array lens is a width of 3 mm and a length of 50 mm, long and narrow, in the above example. These values, if expressed as an aspect ratio relating to the width and the length of one cylindrical lens, are 50/3, or approximately 16.7. On the other hand, the size of one cylindrical lens structuring the seven partition cylindrical array lens is a width of 7 mm and a length of 50 mm, relatively fat, in the above example. When expressed as an aspect ratio, this is 50/7, or approximately 7.1.

It is therefore easy to make the seven partition cylindrical array lens thinner from the viewpoint of a manufacturing technique. However, if the energy distribution of the linear laser beam obtained by the above 28 partitions is investigated in detail, it is understood that the energy near the centerline in the width direction of the linear laser beam clearly differs from the energy near the edges of the linear laser beam in the same direction. The energy, which possesses a higher energy, differs from every time optical adjustment is performed. Therefore, no matter how much the number of partitions of the seven partition cylindrical array lenses is increased, the energy distribution within the linear laser beam will not tend toward a uniform direction, and it will only have a non-uniform distribution in the width direction of the linear laser beam.

Based on the above considerations, the only way to manufacture an optical system through which a very uniform laser anneal effect can be expected is to increase the number of partitions of the four partition cylindrical array lens.

However, the lenses structuring the optical system are of synthetic quartz, which is difficult to process. Further, the cylindrical lens of 3 mm width and 50 mm length structuring the cylindrical array lens given in the above example has a shape which is extremely slender as a lens, and therefore a high degree of technical skill is required for independent manufacturing of the lenses.

The above cylindrical array lens is made into a cylindrical array lens by mutually joining the cylindrical lenses manufactured one by one. Or, the cylindrical array is made by exposure to high temperature after forming the array, causing unification. Therefore, each cylindrical lens is initially separate.

In order to give each of the cylindrical lenses sufficient strength and precision, it is necessary for the aspect ratio between the lens width and the lens length to be at least equal to or less than 20. This value is based on experience of the applicant of the present invention. For example, in addition to the above cylindrical array lens, by forming 8 cylindrical lenses having a length of 60 mm and a thickness of 2 mm, lining up the cylindrical lenses in the width direction and putting them into a frame, the formation of the cylindrical array lens can be performed, but the precision is completely insufficient. In addition, the directionality of the laser beams passing through each cylindrical lens becomes so scattered that it can be understood by the naked eye, and the energy uniformity of the linear laser beam obtained becomes worse than that of the example shown previously. This example has an aspect ratio of 30.

For example, the width of all of the cylindrical lenses contained in the cylindrical array lens 102 in the example of the optical system shown in FIG. 1 is halved, and the number of partitions is doubled to 8 partitions, then the aspect ratio of one cylindrical lens contained in the cylindrical array lens 102 becomes 33, becoming larger than that of the cylindrical array lens of 2 mm width formed earlier.

In order to increase the number of partitions without increasing the aspect ratio of the cylindrical lenses structuring the cylindrical array lens, a method of expanding the laser beam output from the laser oscillator by using a beam expander can be used, but if the aberration of the doublet cylindrical lens 108 is not reduced by the amount that the laser beam is expanded, then a new problem develops in which the laser beam does not sufficiently unify on the irradiation surface.

An example of specification of the doublet cylindrical lens 108 is shown below, in accordance with FIG. 7. The doublet cylindrical lens 108 has a focal distance of 175 mm, a width of 70 mm, and a length of 160 mm, with a center thickness of 31 mm. The above lens has curvature in the width direction. The radius of curvature of a laser beam incidence surface 701 is 125 mm, the radius of curvature of a next surface 702 is 69 mm, and the center distance between the surfaces 701 and 702 is set to 10 mm. One cylindrical lens can be made with this structure. A second cylindrical lens has a laser beam incidence surface 703 placed at a center distance of 1 mm away from the surface 702. The radius of curvature of the laser beam incidence surface 703 is 75 mm, and the radius of curvature of a next surface 704 is set to −226 mm. The center distance between the surfaces 703 and 704 is 20 mm. Symbols attached to the radius of curvature show the curvature direction.

An example of computing the spot size in the focal point of a doublet lens possessing a curvature similar to that of the doublet cylindrical lens 108 by using the optical design software Zemax is shown in FIGS. 12A and 12B. FIG. 12A shows the beam spot when parallel light with a wavelength of 308 nm and a diameter of 24 mm is incident on the above doublet lens. The spot size becomes approximately 50 μm. Therefore, when the laser beam is incident on the doublet cylindrical lens 108, if the width of the laser beam is assumed to be 24 mm, then it can be found that the diffusion in the width direction of the linear laser beam becomes on the order of 50 μm. The width of the linear laser beam made by the optical system in the above example is 400 μm, and therefore, the ratio of the above width to the width of the linear laser beam in the diffusion region exceeds a ratio of 10%. This diffusion becomes a cause of the formation of horizontal stripes in a silicon film.

On the other hand FIG. 12B shows the beam spot when parallel light with a wavelength of 308 nm and a diameter of 12 mm is incident on the above doublet lens. The spot size becomes equal to or less than 4 μm. This corresponds to diffusion on the order of 1% of the linear laser beam width. Demanding a higher precision than this is difficult from the standpoint of precision of lens manufacture.

From the above simulation results, it can be understood that in order to suppress the influence of the aberration of the doublet cylindrical lens 108, the size of the incident laser beam should be made as small as possible. Or, generally, the doublet cylindrical lens 108 must be replaced by an aspherical lens, or it must be replaced by a high precision lens equal to or better than a triplet lens structured by three lenses.

With present techniques, it is extremely difficult to ashperically process synthetic quartz. Further, forming a triplet lens is also not advisable from the viewpoint of cost or adjustment. The thinner the width of the laser beam generated by the oscillator is made, the more the aberration of the doublet cylindrical lens 108 can be suppressed, and therefore it is not preferable to make the size of the laser beam generated by the oscillator much greater than on the order of 10×30 mm (with 10 mm corresponding to the width of the laser beam).

Considering the above, it can be expected that, with the present structure, the number of partitions of the four partition cylindrical array lens can only be increased to around five partition. With this number of partitions, the energy uniformity of the linear laser beam will not change from the present state. Although it is understood that the surface area of a portion for the edge energy diffusion in the width direction of the linear laser beam increases, the current situation is that the number of laser beam partitions is increased by a method of expanding the width of the laser beam using a beam expander to secure the above uniformity.

SUMMARY OF THE INVENTION

An object of the present invention is to eliminate the above problems by providing a laser irradiation apparatus for obtaining a polycrystalline silicon film having a little stripe patterns.

The applicant of the present invention solves this problem by using a cylindrical array lens mentioned below as a substitute for the cylindrical array lens 102.

In other words, the cylindrical array lens used by the present invention is integrally formed in order to ensure strength and precision. This type of cylindrical lens can be formed by etching or shaving, for example. The meaning of integrally formed is that mutually adjacent cylindrical lenses become integrated before forming the lens surface.

The aspect ratio of one cylindrical lens structuring the cylindrical array lens may be made equal to or greater than 20 without problems in strength or precision because the above cylindrical array lens is integrally formed.

The following can be given as an example of a current integrally formed cylindrical array lens: for example, there is one in which from 10 to 50 cylindrical lenses having a 1 mm width are lined up, with a length of 50 mm and a radius of curvature of 20 mm. The directionality of a laser beam passing through each of the cylindrical lenses has a precision of +/−1%. Further, the focal distance of the respective lenses is held within a range of +/−3%. (Catalog values)

The applicant of the present invention was lead to an idea of first incorporating the above integrally formed cylindrical array lens into the optical system for forming the linear laser beam. It is necessary to use the integrally formed cylindrical array lens in the optical system for forming the linear laser beam because the linear laser beam is extremely thin (having an aspect ratio equal to or greater than. 100).

The aspect ratio of the cylindrical lenses of 1 mm width structuring the above integrally formed cylindrical array lens is 50. The effect resulting from integrally forming the cylindrical array lens is that such a minute lens can be manufactured.

The present invention has been invented based on the progress of such techniques. Namely, the present invention is a laser irradiation apparatus for irradiating a laser beam having a cross-sectional shape which is linear in an irradiation surface, comprising:

a laser oscillator for generating the laser beam;
an optical system; and
a stage which moves in at least one direction,
wherein the optical system has:
a first optical system (corresponding to 401a and 401b in FIG. 4) comprising an integrally formed cylindrical array lens which fulfills a role of partitioning the laser beam in a direction which is perpendicular to the direction in which the laser beam is moving;

a second optical system (corresponding to 402 and 406) that fulfills a role of joining the partitioned laser beams by the first optical system on the irradiation surface;

a third optical system (corresponding to 403 in FIG. 4) which fulfills a role of partitioning the laser beam in a direction which is in a plane perpendicular to the perpendicular direction and perpendicular to the direction in which the laser beam is moving; and a fourth optical system (corresponding to 404 in FIG. 4) that fulfills a role of joining the partitioned laser beams by the third optical system on the irradiation surface, wherein the aspect ratio relating to the width and the length of one cylindrical lens forming the integrally formed cylindrical array lens is equal to or greater than 20.

In addition, another structure is a laser irradiation apparatus for irradiating a laser beam having a cross-sectional shape which is linear in an irradiation surface, comprising:

a laser oscillator for generating a rectangular-shape laser beam;

an optical system; and a stage which moves in at least one direction, wherein the optical system has:

a first optical system (corresponding to 401a and 401b in FIG. 4) comprising an integrally formed cylindrical array lens which fulfills a role of partitioning the laser beam in a direction which is perpendicular to the direction in which the laser beam is moving;

a second optical system (corresponding to 402 and 406) that fulfills a role of joining the partitioned laser beams by the first optical system on the irradiation surface;

a third optical system (corresponding to 403 in FIG. 4) which fulfills a role of partitioning the laser beam in a direction which is in a plane perpendicular to the perpendicular direction and perpendicular to the direction in which the laser beam is moving; and a fourth optical system (corresponding to 404 in FIG. 4) that fulfills a role of joining the partitioned laser beams by the third optical system on the irradiation surface, wherein the width of one cylindrical lens forming the integrally formed cylindrical array lens is equal to or less than 1/6 of the length of the short side of the rectangular-shape laser beam.

The rectangular-shape laser beam is defined by a region in which the energy is equal to or greater than 5% of the maximum energy of the energy distribution within the face of the rectangular-shape laser beam, and the length of the short side of the rectangular shape laser beam is defined by the length of the short side of the largest rectangular shape in the above region.

Making the present invention equal to or less than 1/6 is because it is possible to have up to five partitions with present techniques, and the structure of the present invention is necessary to have six or more partitions.

As to the above any structure of the present invention, if the above longitudinal direction of the laser beam, which has a linear cross-sectional shape on the irradiation surface, and the movement direction of the above stage which moves in at least one direction form a right angle, then the productivity is high, which is preferable.

As to the above any structure of the present invention, if the above laser oscillator is one which generates an excimer laser, then a large output can be obtained and the productivity can be increased, which is preferable. In addition to the excimer laser, YAG laser harmonics exist as a pulse emission laser apparatus with which a large output can be obtained at a wavelength region with a high absorption coefficient with respect to the semiconductor film. This may also be used with the present invention.

As to the above any structure of the present invention, if the number of cylindrical lenses structuring the integrally formed cylindrical array lens is equal to or greater than six, then a very uniform laser anneal becomes possible.

If each of the above laser irradiation apparatus has a load-unload chamber, a transfer chamber, a preheating chamber, a laser irradiation chamber, and an annealing chamber, then it can be used for large-scale production, which is preferable.

BRIEF DESCRIPTION OF THE DRAWINGS

In the accompanying drawings:

FIG. 1 is an optical system for forming a linear laser beam;

FIG. 6 is a diagram showing an optical system for forming a linear laser beam in an embodiment of the present invention;

DETAILED DESCRIPTION OF THE PREFERRED EMBODIMENTS

First, an example is shown of irradiating a laser beam processed into a linear shape onto an irradiation surface of a substrate having a 5 inch diagonal as an irradiation object.

Figure 2:
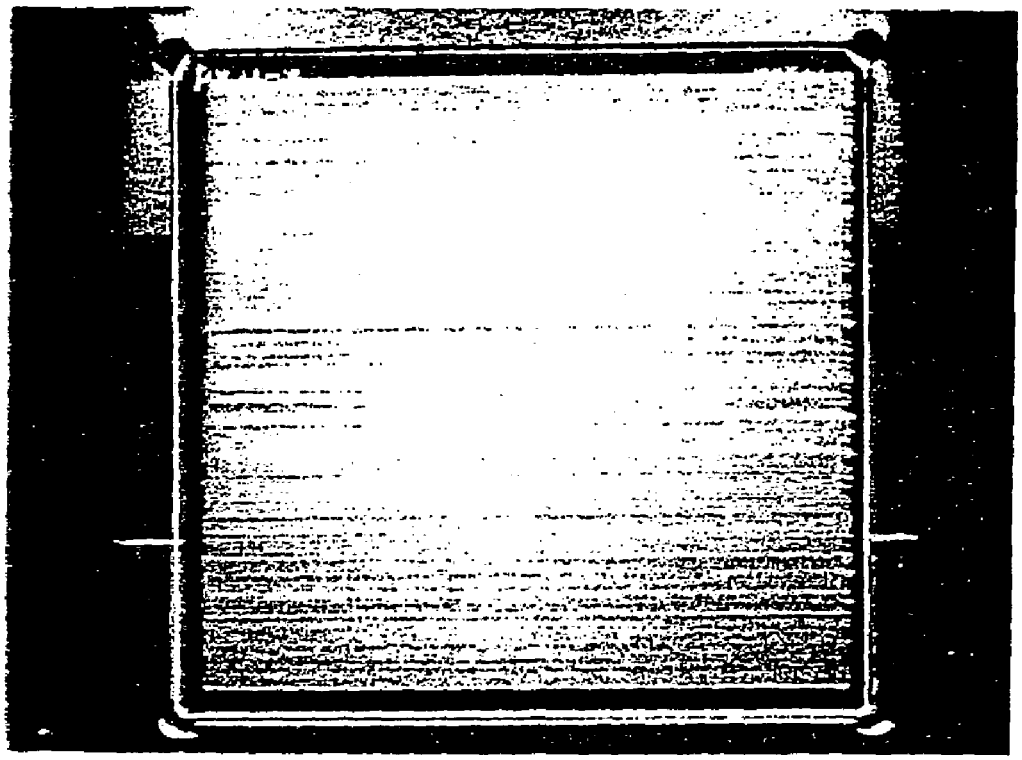
FIG. 2 is a diagram showing the state of a silicon film on which a linear laser beam has been irradiated while scanning.
Figure 3:
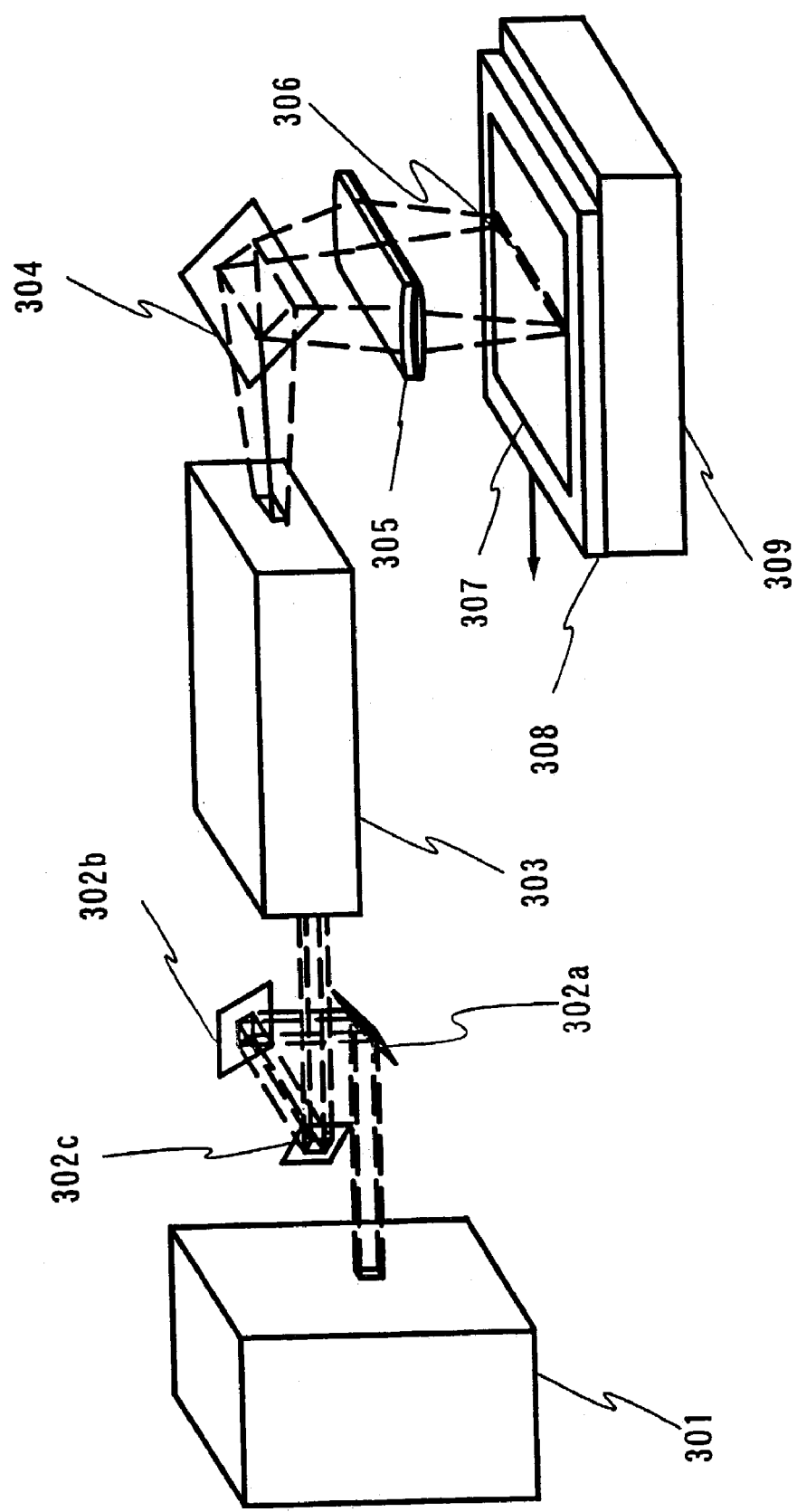
FIG. 3 is a diagram showing an example of an optical system for forming a linear laser beam disclosed by the present invention.

FIG. 3 shows a laser irradiation apparatus. An example of an apparatus irradiating a linear laser beam on a substrate is shown in FIG. 3. The composition of the apparatus is explained below.

A laser beam generated from a laser oscillator 301 and having a size of 10×30 mm is made incident to an optical system 303 via a mirror 302a, a mirror 302b, and a mirror 302c. The mirrors are installed in order to control the incidence direction of the laser beam with respect to the optical system. First, the laser beam is turned toward the top by the mirror 302a, the laser beam is next turned to the horizontal direction by the mirror 302b, and is additionally turned in other horizontal directions by the mirror 302c.

The laser beam which leaves the optical system 303 goes to a mirror 304 and is condensed as a linear laser beam 306 on the surface of a substrate 307 by a doublet cylindrical lens 305. Reference numeral 308 denotes a stage upon which the substrate 307 is placed. The stage 308 scans in a right-angle direction with respect to the linear laser beam 306 (in the direction of the arrows in the figures) by a motion mechanism 309. The laser beam is thus irradiated over the entire surface of the substrate 307. A mechanism such as a ball screw or a linear motor is used in the motion mechanism 309.

By suppressing the expansion angle of the laser beam by inserting a beam collimator between any two of the above mirrors, the energy uniformity of the linear laser beam obtained is increased. It is good to control the expansion angle of the laser beam in the short side direction of the laser beam. The angle of expansion in the short side direction of the laser beam is generally on the order of 0.5 mrad.

Figure 4:
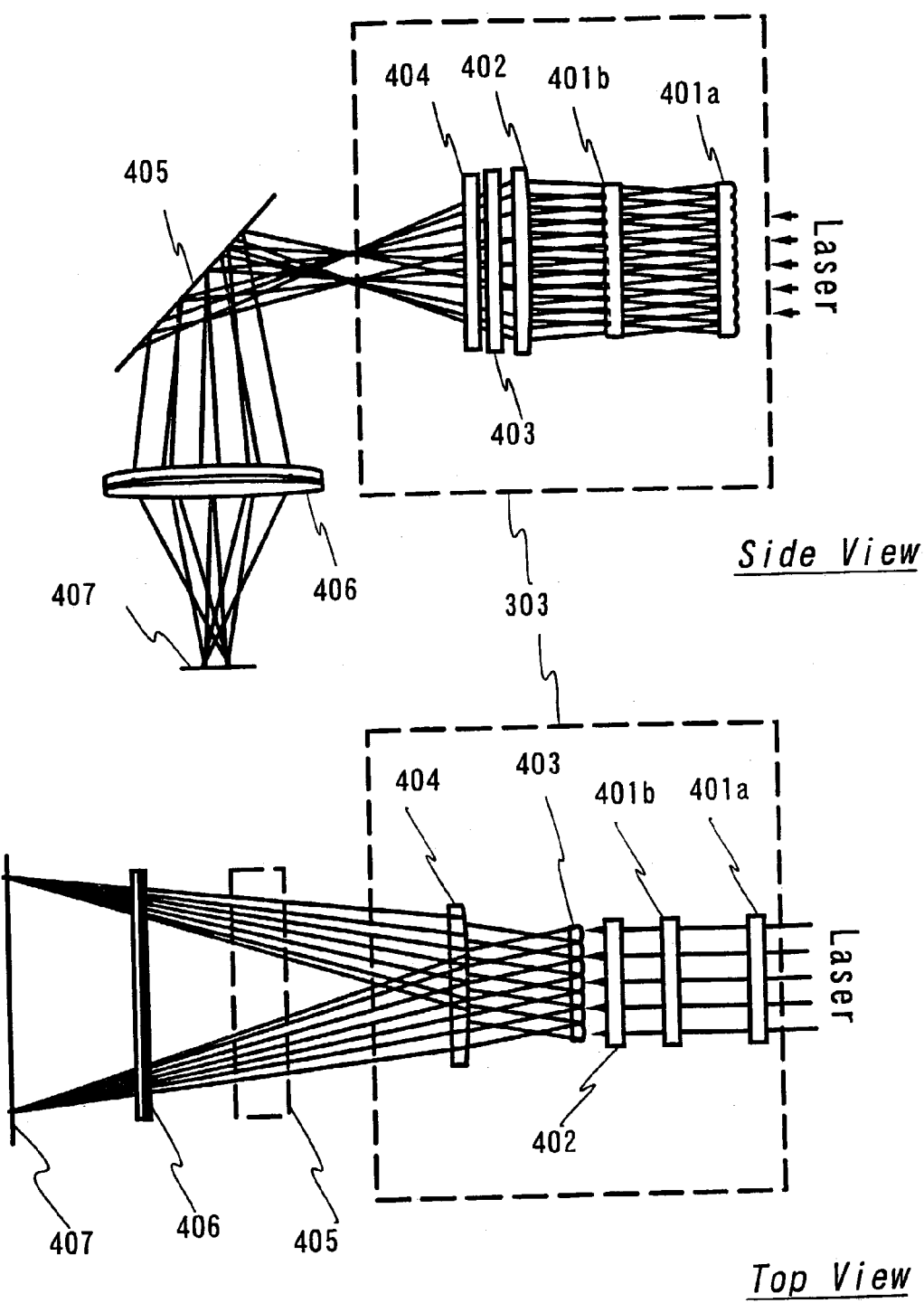
FIG. 4 is a diagram showing an example of a laser irradiation apparatus disclosed by the present invention.

Next, the composition of an optical system that determines the uniformity in the width direction of the linear laser beam, and its width, is explained in accordance with FIG. 4. Lenses 401 to 404 of FIG. 4 are inside the optical system 303 of FIG. 3. The mirror 304 of FIG. 3 is the same as a mirror 405 of FIG. 4. Further, the doublet cylindrical lens 305 of FIG. 3 is the same as a doublet cylindrical lens 406 of FIG. 4.

The laser beam is partitioned 12 times in the width direction by an integrally formed cylindrical array lens 401a made from 12 cylindrical lenses. The laser beams are then made incident to the respective cylindrical lenses of an integrally formed cylindrical array lens 401b made from 12 cylindrical lenses. The laser beams are condensed on a surface by a cylindrical lens 402. The laser beams are again separated, and are condensed on an irradiation surface 407 by a doublet cylindrical lens 406. A mirror 405 is inserted within the light path, turning the light path at a right angle.

The composition of an optical system for determining the uniformity in the length direction of the linear laser beam, and its length, is explained next. The cylindrical array lens 403 partitions the laser beam into 7 partitions in the longitudinal direction. The laser beams are then composed into one laser beam on the irradiation surface 407 while being stretched by the cylindrical lens 404.

Thus a substrate on which a non-single crystal semiconductor film is formed is placed on the irradiation surface 407. By moving the substrate in a direction having a right angle to the linear laser beam, the laser beam can be irradiated over the entire surface of the substrate.

Note that in order to protect the optical system, an atmosphere such as nitrogen, which does not easily react with lens coating substances, may be placed around the optical system. The optical system may also be sealed in a protecting chamber in order to accomplish this. If coated quartz is used in a laser window for entering and leaving the protecting chamber, then a high transmissivity equal to or greater than 99% can be obtained. Further, in order to prevent contamination of the substrate, a chamber may be formed and laser beam irradiation may be performed in a state having the substrate inside the chamber.

The stage 308 is moved at a constant speed in a direction perpendicular to the longitudinal direction of the linear laser beam 306 by the motion mechanism 309.

If the substrate is irradiated with strong light, and heated by an infrared lamp in a location at which the laser beam is irradiated, while the laser beam is being irradiated, then a polycrystalline silicon film having very high uniformity can be obtained.

The structure of the above optical system may be designed in accordance with geometric optics. Specific examples of parameters such as the focal length of each lens are recorded in the embodiments of the present invention. Points that should be taken into consideration when designing the structure are stated below.

First, the integrally formed cylindrical array lenses 401a and 401b should be composed of convex lenses. This is because, if they are structured by concave lenses, then the array lenses become difficult to manufacture because of sharp portions which appear on the array lenses.

Further, when using convex lenses to structure the integrally formed cylindrical array lenses 401a and 401b, the minimum distance d between the principal point (a technical term relating to lenses, and in general the distance between the principal point and the focal point is defined as the focal length) of the integrally formed cylindrical array lens 401a and the lens 401b is made longer than 1.1f, and shorter than 1.9f. The symbol f denotes the focal length of the cylindrical array lens 401a here. The positional relationship between the integrally formed cylindrical array lenses 401a and 401b is shown in FIG. 5A.

Figure 5A:
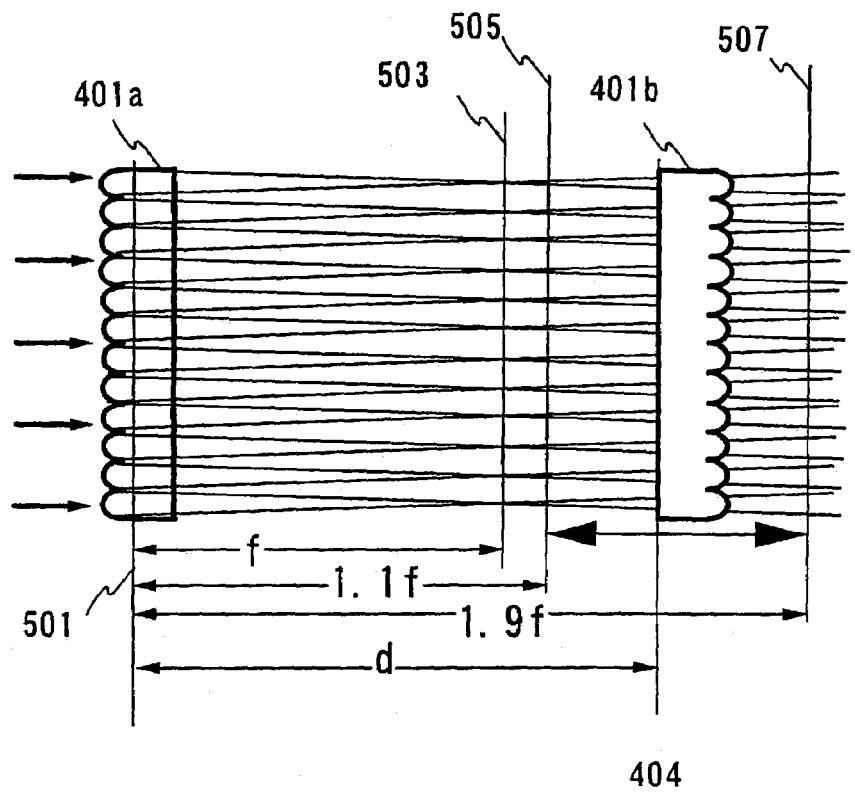
FIGS. 5A and 5B are diagrams for explaining points which must be considered when designing an optical system for forming a linear laser beam.

The symbols used in FIG. 5A are explained. A plane 501 denotes a plane containing all of the principal points of the cylindrical array lens 401a in the motion direction of the laser beam. A plane 503 denotes a plane containing all of the focal points of the cylindrical array lens 401a in the motion direction of the laser beam. A plane 505 denotes a plane separated at a distance of 1.1f from the plane 501. A plane 507 denotes a plane separated at a distance of 1.9f from the plane 501. The cylindrical array lens 401b is placed within a region sandwiched by the plane 505 and the plane 507.

The minimum value 1.1f exists in order to prevent the energy density of the laser beam incident on the integrally formed cylindrical array lens 401b from becoming extremely high. The maximum value of 1.9f exists in order to prevent one partitioned laser beam from being incident upon two or more cylindrical lenses. It is preferable to reduce this range to between 1.3f and 1.7f. The design margin of the optical system can thus be widened.

Figure 5B:
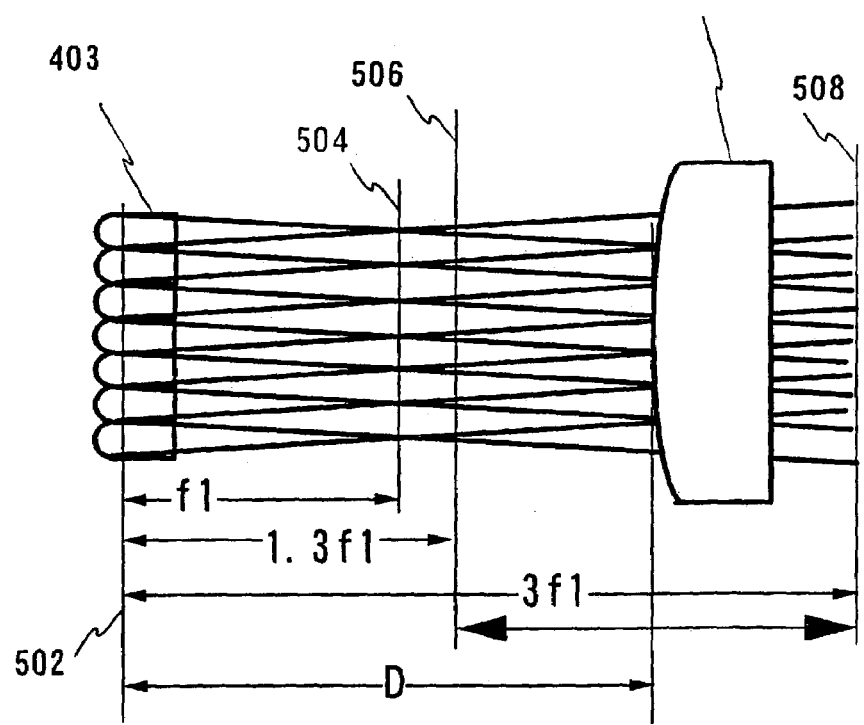

Another point that must be considered is that in order to suppress spherical aberration of the cylindrical lens 404, the minimum distance D between the principal point of the cylindrical array lens 403 and the cylindrical lens 404 is set 1.3f1<D<3f1. The symbol f1 denotes the focal length of the cylindrical array lens 403 here. FIG. 5B shows the positional relationship between the cylindrical array lens 403 and the cylindrical lens 404.

The symbols used in FIG. 5B are explained. A plane 502 denotes a plane containing all of the principal points of the cylindrical array lens 403 in the motion direction of the laser beam. A plane 504 denotes a plane containing all of the focal points of the cylindrical array lens 403 in the motion direction of the laser beam. A plane 506 denotes a plane separated at a distance of 1.3f1 from the plane 502. A plane 508 denotes a plane separated at a distance of 3f1 from the plane 502. The cylindrical lens 404 is placed within a region sandwiched by the plane 506 and the plane 508.

The minimum value 1.3f1 exists in order that the energy density of the laser beam striking the cylindrical lens 404 does not become large. Further, the maximum value of 3f1 exists in order to suppress the spherical aberration of the cylindrical lens 404. The energy distribution of the linear laser beam thus becomes very uniform. When the influence of the spherical aberration of the cylindrical lens 404 is strong, a shape of the linear laser beam is not a rectangular shape, and therefore, a width of the center part of the linear laser beam becomes narrow.

An example such that the width of the center part of the linear laser beam is narrow, as described above, is shown below. For instance, the minimum distance D is made equal to the sum of the focal length f1 of the cylindrical array lens 403 and the focal length f2 of the cylindrical lens 404.

This optical system combination plays a role of stretching out the laser beam, and therefore f1<<f2.

The condition of 3f1<D(=f1+f2) is therefore satisfied in this case. By incorporating an optical system which satisfies the condition 3f1<D, the linear laser beam having an energy distribution such as that of FIG. 10, the result of modeling using the optical design software SOLSTIS, can be obtained. The dark portion in the figure is a portion of high energy. In order to make the energy distribution easy to see in the figure, the aspect ratio is expressed as one smaller than the actual aspect ratio. The linear laser beam expands slightly in edge portion in the longitudinal direction of the linear laser beam, and becomes diffuse. This is due to the influence of the spherical aberration of the cylindrical lens 404.

In order to suppress the spherical aberration of the cylindrical lens 404, a method of composing the lens of a plurality of lenses, or a method of using a lens having a very small spherical aberration as the aspherical lens may be used. With present techniques, the manufacture of aspherical lenses is extremely difficult, and structuring the lens by a plurality of lenses is practical.

Figures 10, 11:
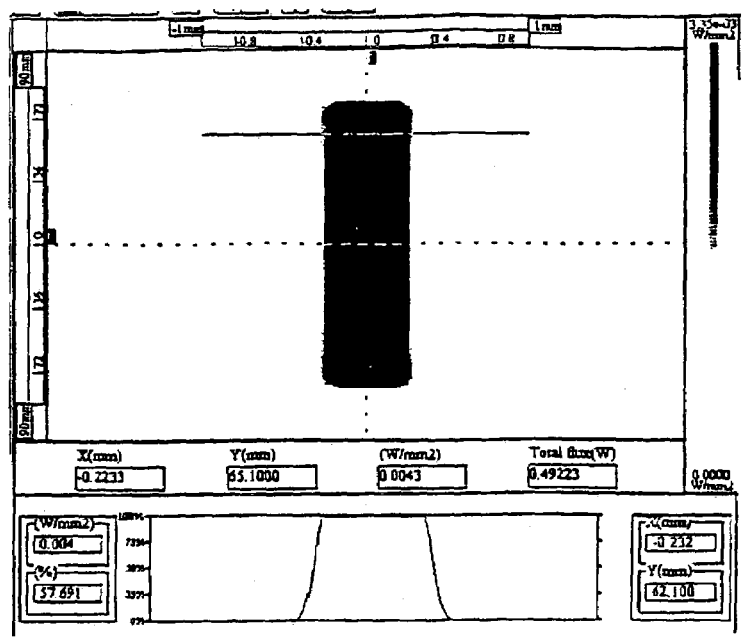
FIG. 10 is a diagram showing a simulation performed by optical design software.
FIG. 11 is a diagram showing a simulation performed by optical design software.
Figure 12A:
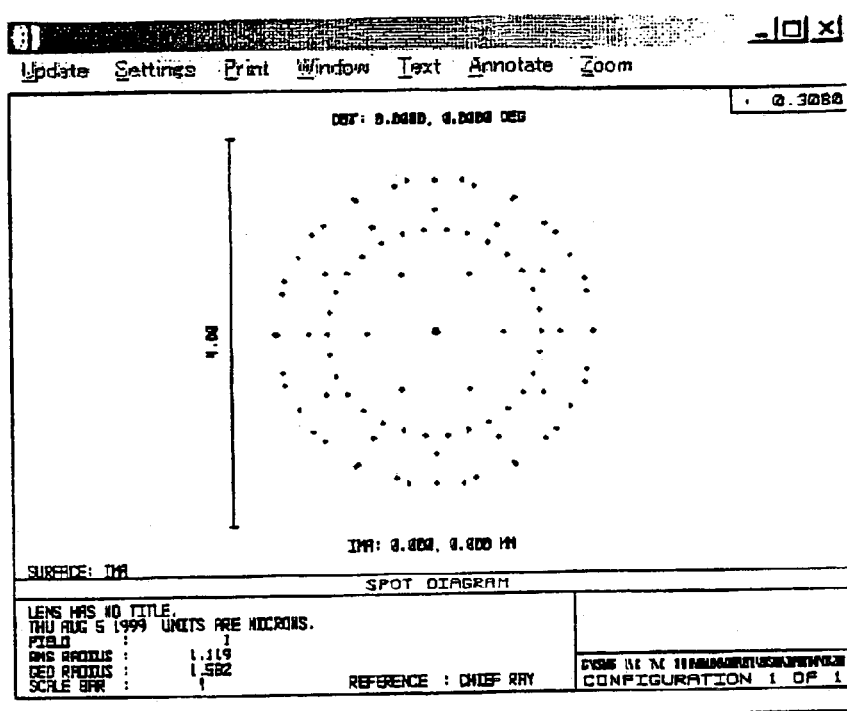
FIGS. 12A and 12B are diagrams showing simulations performed by optical design software.
Figure 12B:
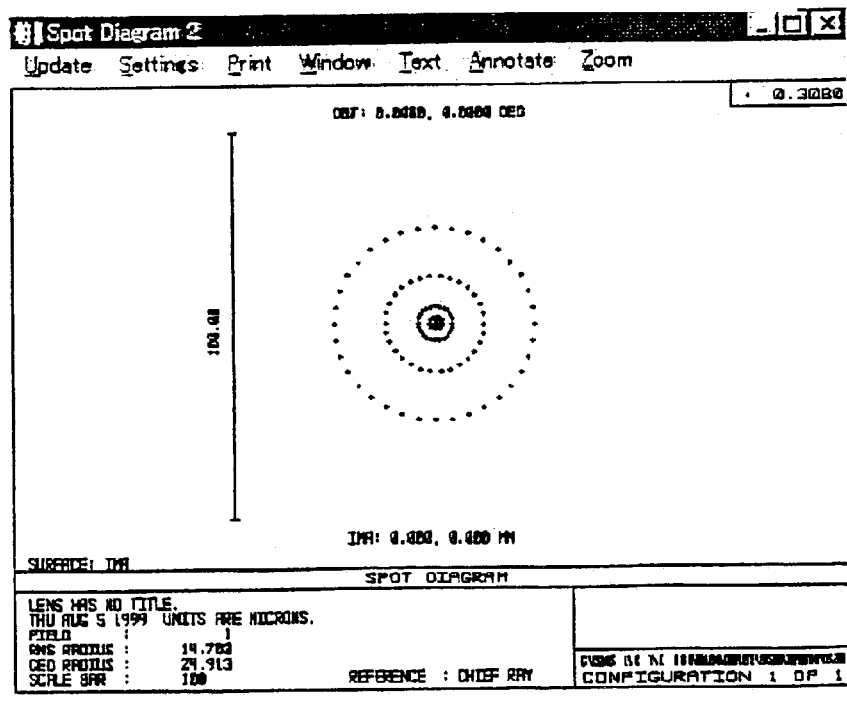

On the other hand, simulation results are shown in FIG. 11 for a case of D within the range of 1.3f1<D<3f1, for example D=2f1. The results shown were calculated using the same software as that of FIG. 10, and it can be understood that the linear laser beam possesses an edge having extremely high linearity.

The laser irradiation apparatus of the present invention can be applied not only to a non-single crystal silicon film, but also to other non-single crystal semiconductor films. For example, it can be applied to non-single crystal semiconductor films such as germanium and diamond.

A semiconductor device, for example, a low temperature polysilicon TFT liquid crystal display device, may be manufactured by a known method using the semiconductor film crystallized by the above laser irradiation apparatus. In addition, other semiconductor devices designed by the operator may also be manufactured.

Embodiment 1

An example of laser anneal of an a-Si film is shown in Embodiment 1. Further, concrete specifications of an optical system are shown. A 300 Hz, 150 W XeCl excimer laser is used as a laser oscillator.

A Corning 1737 substrate with a thickness of 0.7 mm is used as a substrate. The substrate has sufficient durability up to a temperature of 600° C. A 200 nm $SiO_2$ film is deposited on one surface of the substrate by plasma CVD. In addition, an a-Si film having a thickness of 55 nm is formed on the $SiO_2$ film. Other method of film deposition, such as sputtering, may also be used.

The substrate with deposited films is heat treated for 1 hour at 500° C. in a nitrogen atmosphere, reducing the hydrogen concentration in the a-Si film. The laser resistance of the a-Si film can thus be greatly increased. A hydrogen concentration within the film on the order of $10^{20}$ atoms/cm$^3$ is suitable.

The laser beam is processed into a linear laser beam having a length of 160 mm and a width of 0.4 mm by the optical system shown in FIG. 4. The optical system shown in FIG. 4 is one example. The laser beam is imaged into the linear shape on the a-Si film. The above size is the size of the laser beam when it is imaged.

The specific size, focal length, and positional relationship for each of the lenses of the optical system recorded in FIG. 4 are shown below. Quartz is used as the parent material for all of the optical systems. Further, a coating with which a transmissivity equal to or greater than 99% can be obtained with respect to the 308 nm wavelength of the XeCl excimer laser beam is used as the coating.

The side view of FIG. 4 is explained first.

The integrally formed cylindrical array lenses 401a and 401b both have the same shape, and are composed of 12 cylindrical lenses having a focal length of 41 mm, a width of 1 mm, a length of 50 mm, and a center thickness of 2 mm. These lenses partition the laser beam in the vertical direction. The reason that the lenses are formed having the identical shape is mainly in order that the lens manufacturing cost can be reduced. It costs less to manufacture two of the same lens than to make two lenses which are different. If it is unreasonable from a design standpoint to make the shapes identical, they may be structured with lenses that are mutually different.

The cylindrical lens 402 has a focal length of 375 mm, a width of 50 mm, a length of 50 mm, and a center thickness of 5 mm. This lens composes the above laser beams, partitioned in the vertical direction, in a certain plane. The above plane is along the light path, and therefore the light is again separated.

The doublet cylindrical lens 406 has a focal length of 175 mm, a width of 70 mm, a length of 160 mm, and a center thickness of 31 mm. The above laser beams partitioned in the vertical direction are composed into one on the irradiation surface by this lens.

The top view is explained next.

The cylindrical array lens 403 is composed of seven cylindrical lenses having a focal length of 43 mm, a width of 7 mm, a length of 50 mm, and a center thickness of 5 mm. The laser beam is partitioned in the horizontal direction by this lens.

The cylindrical lens 404 has a focal length of 1000 mm, a width of 50 mm, a length of 50 mm, and a center thickness of 5 mm. The above laser beams partitioned in the horizontal direction are composed into one laser beam on the irradiation surface by this lens.

The above lenses all possess curvature in the width direction.

The arrangement of lenses may be in accordance with FIG. 6. Lenses possessing symbols identical to those of FIG. 4 are lenses having identical roles.

Namely, the distance between the integrally formed cylindrical array lens 401a and the integrally formed cylindrical array lens 401b is 75 mm, and the faces possessing curvature face mutually to the outside.

The distance between the integrally formed cylindrical array lens 401b and the cylindrical lens 402 is set to 50 mm.

The distance between the cylindrical lens 402 and the cylindrical array lens 403 is 180 mm, and the distance between the cylindrical array lens 403 and the cylindrical lens 404 is set to 87 mm. The respective faces of the cylindrical lens 402, the cylindrical array lens 403, and the cylindrical lens 404 possessing curvature face toward the laser oscillator.

The optical distance between the cylindrical lens 404 and the doublet cylindrical lens 406 is set to 720 mm. This is made to go via the mirror 405 along the path. The laser light path is bent down by 90° by the mirror 405.

The distance between the doublet cylindrical lens 406 and the irradiation surface 407 is 252 mm.

Figure 7:
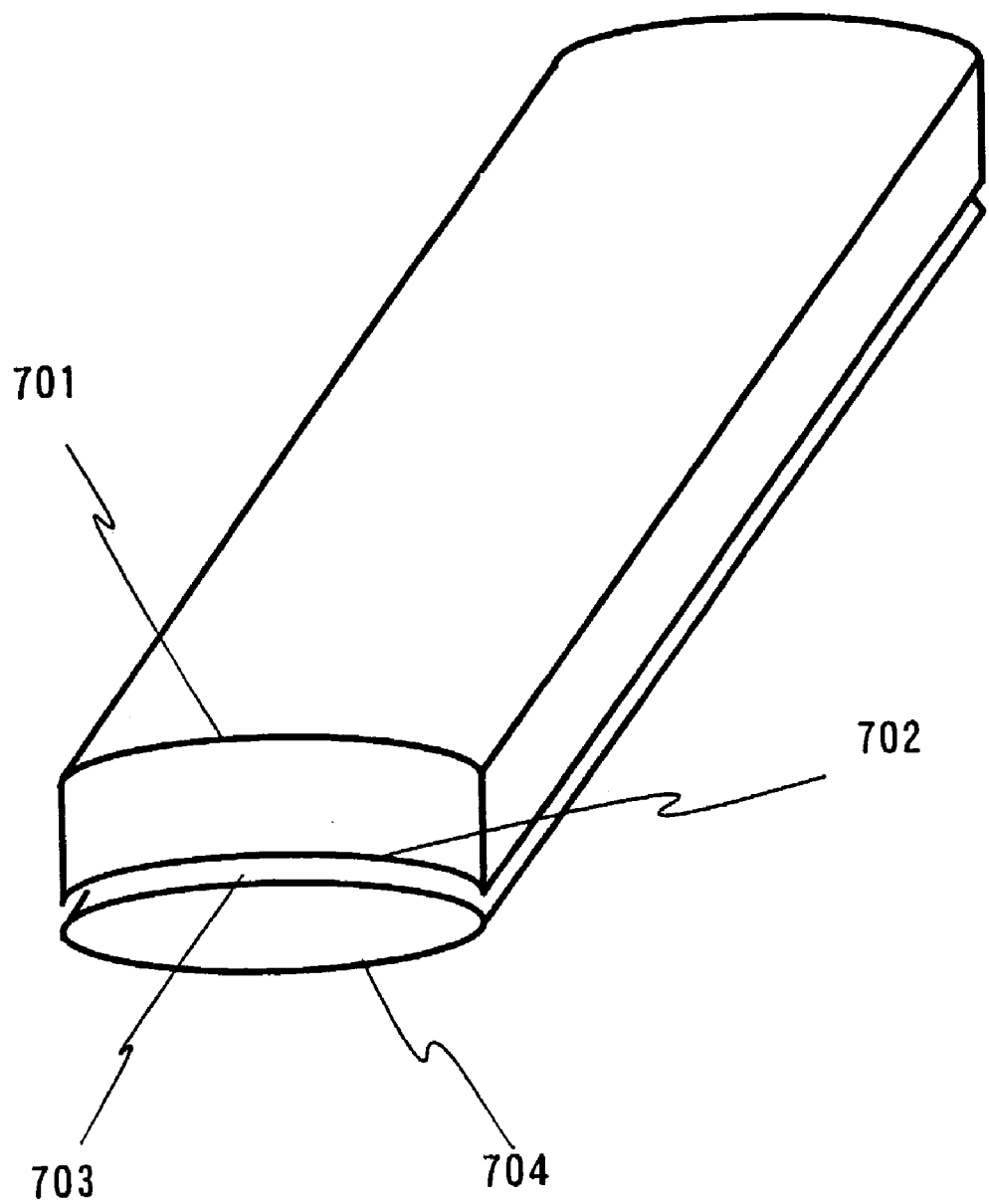
FIG. 7 is a diagram showing a portion of an optical system for forming a linear laser beam in an embodiment of the present invention.

The shape of the doublet cylindrical lens 406 was explained above in accordance with FIG. 7. Namely, it is the same as the doublet cylindrical lens 108.

When one wants to change the size of the linear laser beam, the focal length or the size of each portion of the optical system may be regulated in accordance with geometric optics.

If the energy distribution of the above linear laser beam in the linear direction is within ±5%, then homogenous crystallization of the a-Si film can be performed. Preferably, if the energy distribution is within ±3%, more preferably within ±1%, then very homogeneous crystallization can be performed. In order to make the energy distribution uniform, it is necessary to use precise lens alignment.

The maximum energy of the XeCl excimer laser used is 500 mJ/pulse. The surface area of the linear laser beam is 0.64 $cm^2$, and therefore the maximum energy density of the linear laser beam obtained is equal to or greater than 500 $mJ/cm^2$.

The a-Si film is crystallized using the laser irradiation apparatus. The length of the linear laser beam is 160 mm, and therefore the laser beam can be irradiated on nearly the entire surface of the substrate by scanning the linear laser beam in one direction with respect to a 5 inch substrate.

The irradiation conditions of Embodiment 1 are shown below.

Linear laser beam energy density: 420 $mJ/cm^2$
Laser repetition frequency: 30 Hz
Substrate motion velocity: 1 mm/sec
Laser beam irradiation atmosphere: within clean room atmosphere equal to or less than class 1000

The above conditions are dependent upon such factors as the laser oscillator pulse width, the state of the film which is irradiated by the laser beam, and the characteristics required by the device manufactured, and therefore the conditions may be suitably determined by the operator in consideration of these factors.

The atmosphere during laser beam irradiation is not limited to the above, and the laser irradiation chamber may be surrounded by a chamber, and $H_2$ may be substituted. Substitution of the atmosphere is mainly performed in order to prevent contamination of the substrate. Gas supply is performed through a gas cylinder. $H_2$, He, $N_2$, or Ar may also be used for the atmosphere. Further, a combination of these gases may also be used. Even if a vacuum is pulled on this atmosphere (equal to or less than $10^{-1}$ torr), the contamination prevention effect remains.

The XeCl excimer laser is used as the laser oscillator, but other high output lasers may also be utilized. Other glass substrates such as Corning 7059 can be used in addition to Corning 1737 as the substrate. A quartz substrate may also be used.

A semiconductor device, for example, a low temperature polysilicon TFT liquid crystal display device, may be formed by a known method using the semiconductor film crystallized by the above laser irradiation apparatus. In addition, a semiconductor device proposed by the operator may also be manufactured.

Embodiment 2

An example of irradiating a laser beam onto a polycrystalline silicon film is shown in this Embodiment.

A Corning glass 1737 having a thickness of 0.7 mm is used as a substrate. The substrate has sufficient durability if it is used under 600° C. A $SiO_2$ film is formed in 200 nm on one surface of the substrate by plasma CVD. Further, an a-Si film is formed in 55 nm on the $SiO_2$ film. Any other film forming method, for example, sputtering may be used.

Next, the above-mentioned a-Si film is crystallized by the method disclosed in Japanese Patent Application Laid-Open No. Hei 7-130652. The method will be described briefly in the following. The above a-Si film is coated with a nickel acetate water solution having a concentration of 10 ppm and then is heated in a nitrogen atmosphere at 550° C. for 4 hours, whereby the a-Si film is crystallized. It is recommended that a spin coat method, for example, be used for applying the nickel acetate water solution. The a-Si film to which nickel is added is crystallized in a short period at low temperatures. It is thought that this is because the nickel acts as the seed crystal of crystal growth to facilitate the crystal growth.

If the polycrystalline silicon film crystallized by the above method is irradiated with the laser beam, it has higher characteristics as a material of a semiconductor device. Accordingly, to improve the characteristics of the above polycrystalline silicon film, the above polycrystalline silicon film is irradiated with the laser beam by using the laser irradiation device used in the preferred embodiment of the present invention. It is possible to utilize Embodiments 1 and 2 by combination.

Embodiment 3

An example is shown in Embodiment 3 of using an optical system that differs from the optical system shown by Embodiment 1. The optical system is explained using FIG. 8. In Embodiment 3, an example in which the distance between the principal point of the integrally formed cylindrical array lens 401a and 401b is kept within the range of 1.3f to 1.7f is shown. The design margin of the optical system can thus be widened. Note that f is the focal length of the integrally formed cylindrical array lens 401a.

Figure 8:
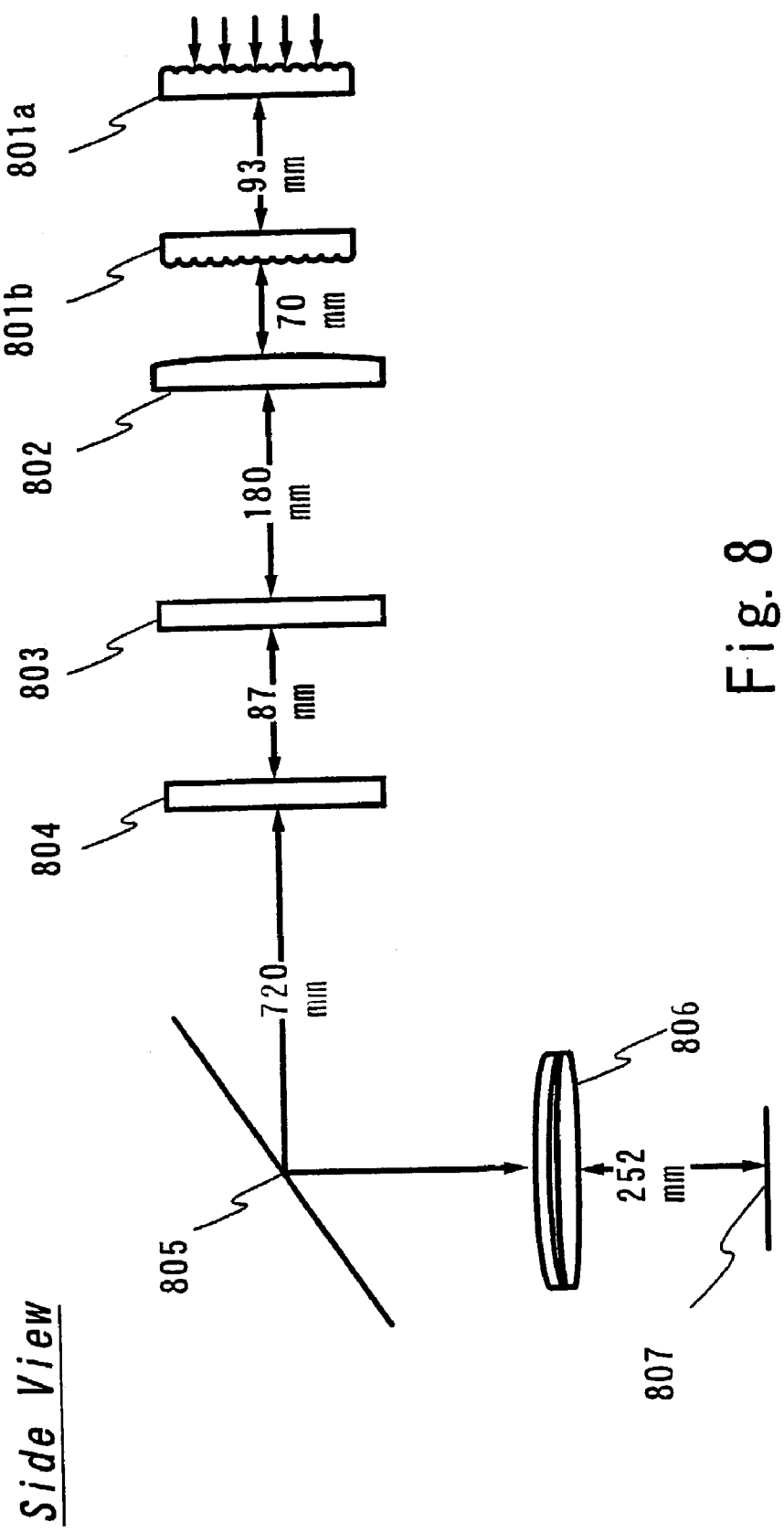
FIG. 8 is a diagram showing an optical system for forming a linear laser beam in an embodiment of the present invention.

The laser beam is processed into a linear laser beam having a length of 160 mm and a width of 0.4 mm on an irradiation surface by the optical system shown in FIG. 8. A semiconductor film, which is an irradiation object, is placed on the irradiation surface. The above size is the size of the linear laser beam on the irradiation surface. The semiconductor film is, for example, one made by the methods of manufacture recorded in Embodiment 1 or Embodiment 2.

The specific size, focal length, and positional relationship for each of the lenses of the optical system recorded in FIG. 8 are shown below. Quartz is used as the parent material for all of the optical systems. Further, a coating with which a transmissivity equal to or greater than 99% can be obtained with respect to the 308 nm wavelength of the XeCl excimer laser beam is used as the coating.

An integrally formed cylindrical array lens 801a is composed of 12 cylindrical lenses having a focal length of 61 mm, a width of 1 mm, a length of 50 mm, and a center thickness of 2 mm. The laser beam is partitioned in the vertical direction by this lens.

An integrally formed cylindrical array lens 801b is composed of 12 cylindrical lenses having a focal length of 41 mm, a width of 1 mm, a length of 50 mm, and a center thickness of 2 mm.

A cylindrical lens 802 has a focal length of 375 mm, a width of 50 mm, a length of 50 mm, and a center thickness of 5 mm. This lens composes the above laser beams, partitioned in the vertical direction, in a certain plane. The above plane is along the light path, and therefore the light is again separated.

A doublet cylindrical lens 806 has a focal length of 175 mm, a width of 70 mm, a length of 160 mm, and a center thickness of 31 mm. The above laser beams partitioned in the vertical direction are composed into one on the irradiation surface by this lens.

A cylindrical array lens 803 is composed of seven cylindrical lenses having a focal length of 43 mm, a width of 7 mm, a length of 50 mm, and a center thickness of 5 mm. The laser beam is partitioned in the horizontal direction by this lens.

A cylindrical lens 804 has a focal length of 1000 mm, a width of 50 mm, a length of 50 mm, and a center thickness of 5 mm. The above laser beams partitioned in the horizontal direction are composed into one laser beam on the irradiation surface by this lens.

The above lenses all possess curvature in the width direction.

The arrangement of lenses may be in accordance with FIG. 8.

Namely, the distance between the integrally formed cylindrical array lens 801a and the integrally formed cylindrical array lens 801b is 93 mm, and the faces possessing curvature face mutually to the outside.

The distance between the integrally formed cylindrical array lens 801b and the cylindrical lens 802 is set to 70 mm.

The distance between the cylindrical lens 802 and the cylindrical array lens 803 is 180 mm, and the distance between the cylindrical array lens 803 and the cylindrical lens 804 is set to 87 mm. The respective faces of the cylindrical lens 802, the cylindrical array lens 803, and the cylindrical lens 804 possessing curvature face toward the laser oscillator.

The optical distance between the cylindrical lens 804 and the doublet cylindrical lens 806 is set to 720 mm. This is made to go via the mirror 805 along the path. The laser light path is bent down by 90° by the mirror 805.

The distance between the doublet cylindrical lens 806 and the irradiation surface 807 is 252 mm.

The shape of the doublet cylindrical lens 806 used is the same as that of the doublet cylindrical lens 406.

When one wants to change the size of the linear laser beam, the focal length or the size of each portion of the optical system may be regulated in accordance with geometric optics.

If the energy distribution of the above linear laser beam in the linear direction is within ±5%, then homogenous crystallization of the a-Si film can be performed. Preferably, if the energy distribution is within ±3%, more preferably within ±1%, then very homogeneous crystallization can be performed. In order to make the energy distribution uniform, it is necessary to use precise lens alignment.

A semiconductor device, for example, a low temperature polysilicon TFT liquid crystal display device, may be formed by a known method using the semiconductor film crystallized by the above laser irradiation apparatus. In addition, a semiconductor device proposed by the operator may also be manufactured.

Embodiment 4

Figure 9:
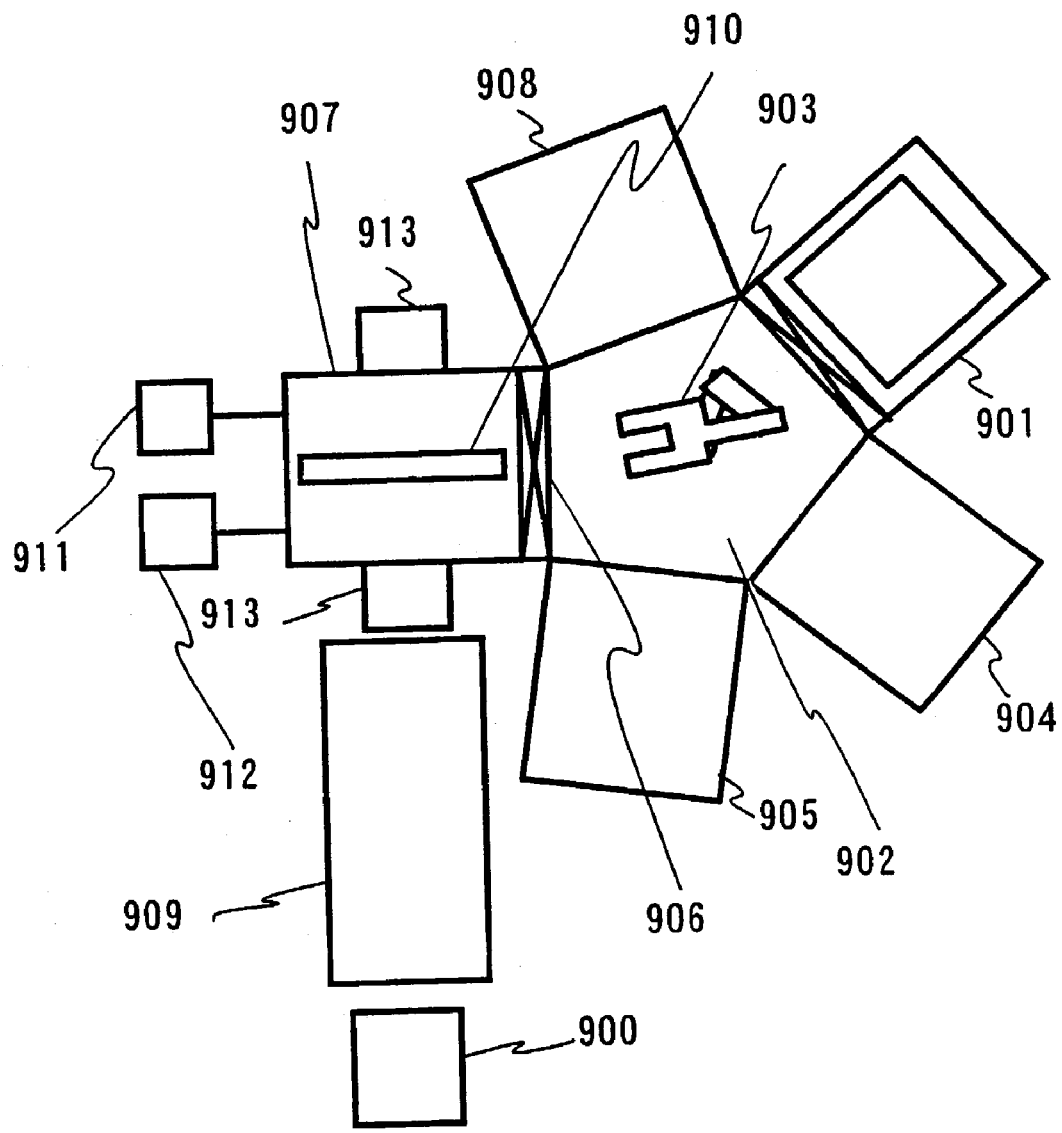
FIG. 9 is a diagram showing a laser irradiation apparatus.

An example of a laser irradiation apparatus for mass production is shown in Embodiment 4 in accordance with FIG. 9. FIG. 9 is a top view of the laser irradiation apparatus.

A substrate is carried from a load-unload chamber 901 by a conveyor robot arm 903 set in a transfer chamber 902. The substrate is first carried to a preheating chamber 905, after position alignment in an alignment chamber 904. The substrate is heated in advance to a predetermined substrate temperature, for example, on the order of 300° C., by using a heater such as an infrared lamp heater. The substrate is subsequently set in a laser irradiation chamber 907 via a gate valve 906. The gate valve 906 is then closed.

The laser beam, after being output from a laser oscillator 900 shown by Embodiment 1, is processed into a linear laser beam on a radiation surface within the laser irradiation chamber 907 by passing through an optical system 909, being bent 90° downward by a mirror set directly above a quartz window 910 but not shown in the figure, and through the quartz window 910. The laser beam is irradiated on the substrate set on the irradiation surface. The optical system stated above may be used for the optical system 909. Further, an optical system based on that optical system may be used.

Before irradiation of the laser beam, the laser irradiation chamber 907 is pulled to a high vacuum ($10^{-3}$ Pa) using a vacuum pump 911. Or, a desired atmosphere may be made by using the vacuum pump 911 and a gas cylinder 912. The atmosphere may be Ar, $H_2$, or a combination of these gases as mentioned above.

By next scanning the substrate by using a motion mechanism 913 while irradiating the laser beam, the substrate is irradiated by the linear laser beam. An infrared lamp not shown in the figure may also be exposed at this time on a portion in which the linear laser beam is being irradiated.

After completion of the laser beam irradiation, the substrate is carried to a cooling chamber 908, and after annealing, the substrate is returned to the load-unload chamber 901 via the alignment chamber 904. By repeating this series of movements, laser annealing can be performed on a plurality of substrates.

Embodiment 4 can be used in combination with the embodiment mode of the present invention or with other embodiments.

What is claimed is:

1. A method for manufacturing a semiconductor device comprising the steps of:
    forming a semiconductor film over a substrate;
    generating a laser beam from a laser oscillator;
    partitioning the laser beam by a pair of integrally formed cylindrical array lenses; and
    forming a linear laser beam on a surface of the semiconductor film by joining the partitioned laser beams,
    wherein the laser beam is partitioned by the pair of integrally formed cylindrical array lenses in a width direction of the linear laser beam which is perpendicular to the direction in which the laser beam is moving,
    wherein the integrally formed cylindrical array lenses are a first integrally formed cylindrical array lens and a second integrally formed cylindrical array lens,
    wherein the laser beam enters from a side of a convex surface to pass through the first integrally formed cylindrical array lens, and
    wherein partitioned laser beams enter from a side of a flat surface to pass through the second integrally formed cylindrical array lens.

2. A method according to claim 1 wherein the laser oscillator is an oscillator which generates an excimer laser.

3. A method according to claim 1 wherein the partitioned laser beams are expanded on the surface of the semiconductor film.

4. A method according to claim 1 wherein the laser beam is defined by a region in which the energy is equal to or greater than 5% of the maximum energy of the energy distribution within the face of the laser beam.

5. A method for manufacturing a semiconductor device comprising the steps of:
  forming a semiconductor film over a substrate;
  generating a laser beam from a laser oscillator;
  partitioning the laser beam in a first direction which is perpendicular to the direction in which the laser beam is moving by using a first optical system comprising a pair of integrally formed cylindrical array lenses;
  joining the partitioned laser beams by the first optical system on a surface of the semiconductor film by using a second optical system;
  partitioning the laser beam in a second direction which is in a plane perpendicular to the perpendicular direction and perpendicular to the direction in which the laser beam is moving by using a third optical system; and
  forming a linear laser beam on a surface of the semiconductor film by joining the partitioned laser beams by the third optical system,
  wherein the first direction is a width direction of the linear laser beam,
  wherein the integrally formed cylindrical array lenses are a first integrally formed cylindrical array lens and a second integrally formed cylindrical array lens,
  wherein the laser beam enters from a side of a convex surface to pass through the first integrally formed cylindrical array lens, and
  wherein partitioned laser beams enter from a side of a flat surface to pass through the second integrally formed cylindrical array lens.

6. A method according to claim 5 wherein the laser oscillator is an oscillator which generates an excimer laser.

7. A method according to claim 5 wherein the partitioned laser beams by the third optical system are expanded on the surface of the semiconductor film.

8. A method according to claim 5 wherein the laser beam is defined by a region in which the energy is equal to or greater than 5% of the maximum energy of the energy distribution within the face of the laser beam.

9. A method for manufacturing a semiconductor device comprising the steps of:
  forming a semiconductor film over a substrate;
  generating a laser beam from a laser oscillator;
  partitioning the laser beam in a first direction which is perpendicular to the direction in which the laser beam is moving by a first optical system comprising a pair of integrally formed cylindrical array lenses;
  joining the partitioned laser beams by the first optical system on a surface of the semiconductor film by using a second optical system;
  partitioning the laser beam in a second direction which is in a plane perpendicular to the perpendicular direction and perpendicular to the direction in which the laser beam is moving by using a third optical system; and
  forming a linear laser beam on a surface of the semiconductor film by joining the partitioned laser beams by the third optical system,
  wherein the first direction is a width direction of the linear laser beam,
    wherein the width of one cylindrical lens constituting the integrally formed cylindrical array lens is equal to or less than ⅙ of the length of the short side of the laser beam,
    wherein the integrally formed cylindrical array lenses are a first integrally formed cylindrical array lens and a second integrally formed cylindrical array lens,
    wherein the laser beam enters from a side of a convex surface to pass through the first integrally formed cylindrical array lens, and
  wherein partitioned laser beams enter from a side of a flat surface to pass through the second integrally formed cylindrical array lens.

10. A method according to claim 9 wherein the laser oscillator is an oscillator which generates an excimer laser.

11. A method according to claim 9 wherein the partitioned laser beams by the third optical system are expanded on the surface of the semiconductor film.

12. A method according to claim 9 wherein the laser beam is defined by a region in which the energy is equal to or greater than 5% of the maximum energy of the energy distribution within the face of the laser bean.

13. A method according to claim 1 wherein the first integrally formed cylindrical array lens becomes integrated before forming the lens surface.

14. A method according to claim 1 wherein the second integrally formed cylindrical array lens becomes integrated before forming the lens surface.

15. A method according to claim 5 wherein the first integrally formed cylindrical array lens becomes integrated before forming the lens surface.

16. A method according to claim 5 wherein the second integrally formed cylindrical array lens becomes integrated before forming the lens surface.

17. A method according to claim 9 wherein the first integrally formed cylindrical array lens becomes integrated before forming the lens surface.

18. A method according to claim 9 wherein the second integrally formed cylindrical array lens becomes integrated before forming the lens surface.

* * * * *